(12) United States Patent
Teranishi et al.

(10) Patent No.: US 10,343,403 B2
(45) Date of Patent: Jul. 9, 2019

(54) METHOD FOR FORMING FILM AND METHOD FOR MANUFACTURING INKJET PRINT HEAD

(71) Applicant: CANON KABUSHIKI KAISHA, Tokyo (JP)

(72) Inventors: Atsushi Teranishi, Kawasaki (JP); Masaya Uyama, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/817,963

(22) Filed: Nov. 20, 2017

(65) Prior Publication Data

US 2018/0147848 A1 May 31, 2018

(30) Foreign Application Priority Data

Nov. 25, 2016 (JP) .................................. 2016-229031

(51) Int. Cl.
*B41J 2/16* (2006.01)
*B81B 1/00* (2006.01)
(Continued)

(52) U.S. Cl.
CPC ............. *B41J 2/16* (2013.01); *B41J 2/14145* (2013.01); *B41J 2/1603* (2013.01); *B41J 2/1623* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *B81B 1/004* (2013.01); *B81C 1/00087* (2013.01); *B41J 2002/14467* (2013.01); *B81B 2201/052* (2013.01);
(Continued)

(58) Field of Classification Search
CPC ........ B41J 2/16; B41J 2/14145; B41J 2/1645; B41J 2/1642; B41J 2/1646; B41J 2/1629; B41J 2/1628; B41J 2002/14467; B81C 1/00087; B81B 2201/052; B81B 1/004; B81B 2203/0353
See application file for complete search history.

(56) References Cited

U.S. PATENT DOCUMENTS 4,228,442 A * 10/1980 Krull .................... B41J 2/16526
347/28
5,886,722 A * 3/1999 Kuehnle .................. B41J 2/005
346/140.1
(Continued)

FOREIGN PATENT DOCUMENTS

JP 2007-098888 A * 4/2007
JP 2007098888 A 4/2007

*Primary Examiner* — Charles D Garber
*Assistant Examiner* — S M Sohel Imtiaz
(74) *Attorney, Agent, or Firm* — Canon U.S.A., Inc. IP Division

(57) ABSTRACT

A method for forming a film that covers a side wall of a through hole in a substrate having the through hole, the method including, in the following order, the steps of providing a substrate having a through hole that passes therethrough from a first surface to a second surface, which is a surface opposite to the first surface, forming, on the first surface, a lid member that blocks an opening of the through hole open on the first surface, recessing, in a direction away from the first surface, a surface of the lid member that blocks the opening by removing part of the lid member through the opening, and forming a film that covers the side wall of the through hole.

20 Claims, 7 Drawing Sheets

(51) Int. Cl.
*B81C 1/00* (2006.01)
*B41J 2/14* (2006.01)
(52) U.S. Cl.
CPC . *B81B 2203/0353* (2013.01); *B81C 2201/019* (2013.01); *B81C 2203/032* (2013.01)

(56) References Cited

U.S. PATENT DOCUMENTS

| | | | |
|---|---|---|---|
| 9,556,015 B1* | 1/2017 | Hung | B81B 1/004 |
| 2004/0124003 A1* | 7/2004 | Ryu | H05K 1/118 |
| | | | 174/254 |
| 2004/0174411 A1* | 9/2004 | Sumiya | B41J 2/1433 |
| | | | 347/47 |
| 2008/0165222 A1* | 7/2008 | Hayakawa | B41J 2/14072 |
| | | | 347/44 |
| 2009/0224259 A1* | 9/2009 | Jung | H01L 27/1248 |
| | | | 257/72 |
| 2009/0294403 A1* | 12/2009 | Kamijima | B82Y 10/00 |
| | | | 216/22 |
| 2010/0272933 A1* | 10/2010 | McCormick | C09J 7/29 |
| | | | 428/34.1 |
| 2013/0076458 A1* | 3/2013 | Katou | C08F 2/48 |
| | | | 333/195 |

* cited by examiner

METHOD FOR FORMING FILM AND METHOD FOR MANUFACTURING INKJET PRINT HEAD

BACKGROUND

Field of the Disclosure

The present disclosure relates to a method for forming a film that covers a side wall of a through hole and a method for manufacturing an inkjet print head.

Description of the Related Art

A through hole may be formed in a substrate in a production process of a micro electro mechanical system (MEMS) device. For example, in order to form an electrode that passes through the substrate, a through hole may be formed or a via may be located. In addition, for example, in an inkjet print head as an example of the MEMS device, an ink supply hole that passes through the substrate may be formed.

In order to protect the inside of such a through hole, a film that covers a side wall of the through hole may be formed. Examples of films include an insulating film that provides insulating properties and a protective film that protects the through hole from the ink.

As a method for forming a film that covers a side wall of a through hole, Japanese Patent Laid-Open No. 2007-98888 describes a method in which part of the inside of a through hole is filled with a releasing layer, a film is formed on a portion that is not covered with the releasing layer of an inner wall, and finally the releasing layer is peeled.

SUMMARY

The present disclosure provides a method for forming a film that covers a side wall of a through hole in a substrate having the through hole, the method including, in the following order, the steps of providing a substrate having a through hole that passes therethrough from a first surface to a second surface, which is a surface opposite to the first surface, forming, on the first surface, a lid member that blocks an opening of the through hole open on the first surface, recessing, in a direction away from the first surface, a surface of the lid member that blocks the opening by removing part of the lid member through the opening, and forming a film that covers the side wall of the through hole.

Further features of the present disclosure will become apparent from the following description of exemplary embodiments with reference to the attached drawings.

DESCRIPTION OF THE EMBODIMENTS

Figure 7A:
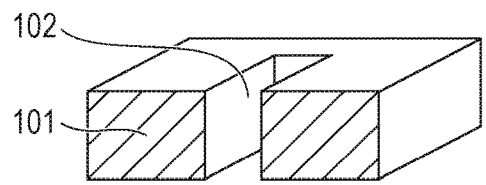
FIGS. 7A to 7D' are diagrams showing the manner of a film that remains at a location at which a through hole in a substrate is blocked, according to an embodiment of the present disclosure.
Figure 7B:
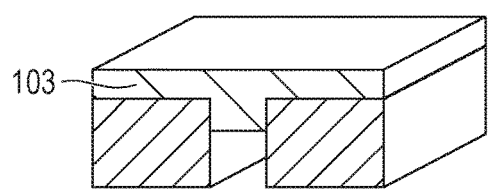
Figure 7C:
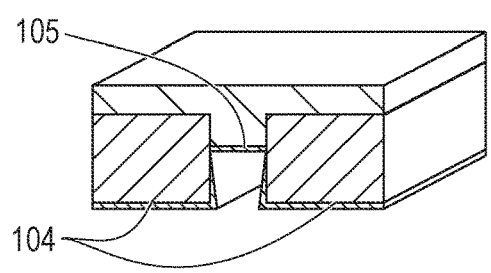
Figure 7D:
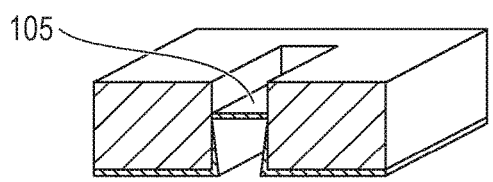
Figure 7D:
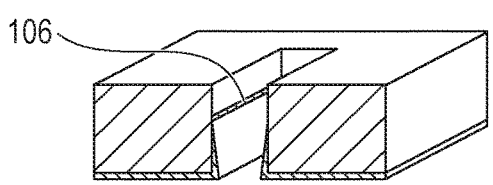

According to investigations performed by the present inventors, when a film is formed on a side wall of a through hole by the method described in Japanese Patent Laid-Open No. 2007-98888, the film may remain so as to block the through hole. The manner of this will be described with reference to FIGS. 7A to 7D'. A substrate 101 shown in FIG. 7A has a through hole 102 that passes through the substrate. Regarding such a substrate, as shown in FIG. 7B, a releasing layer 103 is formed such that part of the inside of the through hole is filled with the releasing layer 103. Thereafter, as shown in FIG. 7C, a film 104 is formed on the inner wall of the through hole and, then, the releasing layer 103 is peeled. As shown in FIG. 7C, the film (film 104) is formed on the side wall of the through hole, and a film (film 105) is also formed on the side surface of the releasing layer 103 corresponding to the ceiling portion of the through hole. If the releasing layer 103 in this state is peeled, the film 105 is not always peeled with the releasing layer 103 and, as shown in FIG. 7D, the film may remain at a location at which the through hole is blocked. Even when the film is removed to some extent, as shown in FIG. 7D', a burr-like film 106 may remain around the side wall of the through hole, or remain so as to partly block the through hole. The film remaining at a location at which the through hole is blocked becomes a factor in interfering with ink flow when, for example, the ink passes the through hole. Meanwhile, even if removal of the film by washing is intended, it is not easy to remove completely because there is a problem in that the film adheres to the substrate 101 and the like during washing.

Therefore, in the present disclosure, regarding a through hole in a substrate, the film is suppressed from remaining at a location at which the through hole is blocked when a film is formed so as to cover the side wall of the through hole.

A method for forming a film according to the present disclosure will be described below.

Figure 1A:
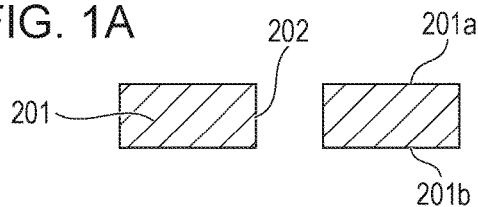
FIGS. 1A to 1E are diagrams showing a method for forming a film that covers a side wall of a through hole, according to an embodiment of the present disclosure.

As shown in FIG. 1A, a substrate 201 having a through hole 202 is prepared. Examples of the substrate 201 include a silicon substrate, a glass substrate, a silicon nitride substrate, a gallium arsenide substrate, a gallium nitride substrate, and an alumina substrate. The through hole 202 is a hole that passes therethrough from a first surface 201a of the substrate 201 to a second surface 201b, which is a surface opposite to the first surface 201a. Examples of methods for forming the through hole 202 include dry etching and wet etching. In particular, the through hole 202 can be formed by dry etching. When a hole almost perpendicular to a thick substrate is formed, the hole can be formed particularly by a bosch process. The bosch process is a technique to anisotropically etch silicon by repeating formation of a deposited film containing carbon as a primary component and etching that uses $SF_6$ gas or the like. Examples of wet etching include crystal anisotropic etching that uses an etchant, e.g., tetramethylammonium hydroxide (TMAH).

Figure 1B:
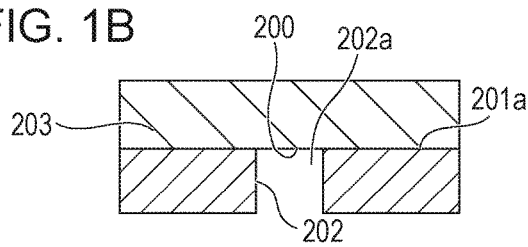

As shown in FIG. 1B, a lid member 203 is formed on the first surface 201a so as to block an opening 202a of the through hole 202 open on the first surface 201a side. For example, a dry film produced by drying a resin is used as the lid member 203. The lid member 203 may be formed of a tape that includes a bonding layer containing the resin on a BASE PLATE. The thickness of the tape is preferably 20 pmun or more and 500 μm or less because a strength at which all steps can be endured is required. Examples of materials for forming the BASE PLATE of the tape include polyethylene terephthalate (PET), polyolefin, polyethylene naphthalate (PEN), polypropylene (PP), and polystyrene (PS). Examples of methods for bonding the tape include a laminate method, in which the tape is bonded to the substrate in air or in a vacuum by roller pressurization that uses a tape laminator. The configuration in which the tape is used has advantages in that the cost is low and the process is simple compared with a laminate in which the dry film is used. When the lid member 203 is peeled afterward, the lid member 203 may be referred to as a releasing layer.

Figure 1C:
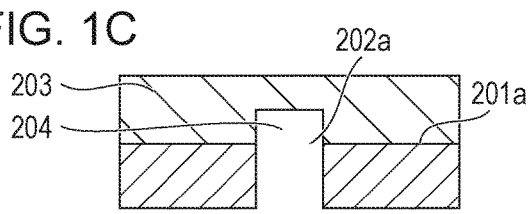
Figure 1C:
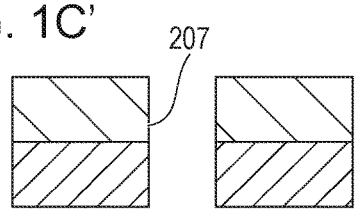

As shown in FIG. 1C, part of the lid member 203 is removed by, for example, performing etching through the opening 202a. In this manner, a surface 200 of the lid member 203 that blocks the opening 202a, as shown in FIG. 1B, is recessed in a direction away from the first surface 201a. As the lid member 203 is removed, a space 204 in the lid member is exposed. Examples of methods for removing the lid member 203 include oxygen plasma ashing and dry etching.

When the surface 200 is recessed in a direction away from the first surface 201a, it is not necessary that the lid member 203 remain over the opening 202a. That is, as shown in FIG. 1C', a space that passes through the lid member 203 may be a through hole 207. When the through hole 207 is formed, the lid member 203 can be formed of a dry film containing a photosensitive resin. This is because the through hole 207 is formed with high accuracy by photolithography compared with the case where formation is performed by oxygen plasma ashing. Examples of the photosensitive resin, which is a material for forming the dry film, include a negative photosensitive resin and a positive photosensitive resin, and a negative photosensitive resin can be used. For example, an epoxy resin may be used as the negative photosensitive resin. A commercially available material, e.g., EHPE-3150 (trade name, produced by Daicel Corporation) may be used. The photosensitive resins may be used alone, or at least two types may be used in combination. In consideration of the degree of freedom of the manufacturing process and the reliability of the product, the photosensitive resin can be a resin having high heat and chemical resistance. Specific examples include a polyimide resin, a polyamide resin, an epoxy resin, a polycarbonate resin, an acrylic resin, and a fluororesin. In particular, an epoxy resin can be used.

When the through hole 207 is formed in the lid member 203, the lid member 203 may also be formed by a transfer method. In the transfer method, a substrate for transfer is prepared, and the substrate for transfer is uniformly lightly coated with an organic resin by a spin coating, slit coating, or spray coating method. The organic resin can be an epoxy resin, a benzocyclobutene resin, a polyamide resin, or the like. In the transfer method, a surface (here, the first surface 201a) to be provided with the lid member 203 of the substrate 201 is caused to come into contact with the resin applied and, thereby, the resin is transferred to the substrate 201. After the transfer, baking is performed at an appropriate temperature for an appropriate time so as to cure the organic resin. The size of the substrate for transfer can be larger than or equal to the size of the substrate 201. The substrate for transfer can be a substrate of silicon, glass, or the like.

Figure 1D:
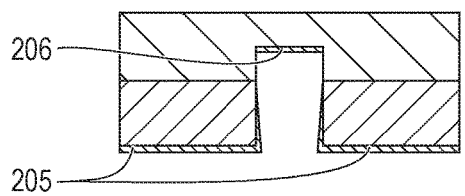

As shown in FIG. 1D, a film 205 that covers the side wall of the through hole is formed. The film 205 is, for example, an inorganic film. Examples of the inorganic film include ceramic, e.g., a silicon oxide film, a silicon nitride film, and a silicon carbide film, and metal films of tantalum, gold, nickel, and the like. Examples of the film formation technique include an atomic layer deposition method (ALD method), a chemical vapor deposition method (CVD method), a sputtering method, and an evaporation method. The film 205 is formed on the side wall of the through hole and on a ceiling portion of the space 204 (film 206).

Figure 1E:
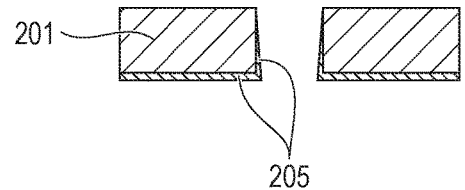

Thereafter, the lid member 203 is removed. The surface of the lid member 203 that blocks the opening 202a is recessed in a direction away from the first surface. Therefore, when the lid member 203 is removed, the film 206 shown in FIG. 1D is easily removed at the same time. In the case shown in FIG. 1C', the through hole is not blocked by the film 206, and the film is removed at the same time as the lid member 203 is removed. As a result, as shown in FIG. 1E, the film is suppressed from remaining at a location at which the through hole is blocked.

Figure 2A:
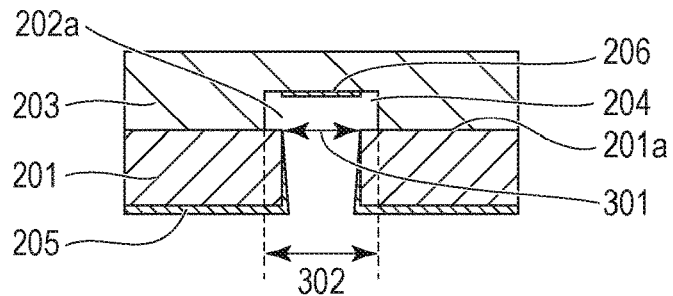
FIGS. 2A to 2D are diagrams showing the shapes of spaces inside lid members, according to an embodiment of the present disclosure.
Figure 2B:
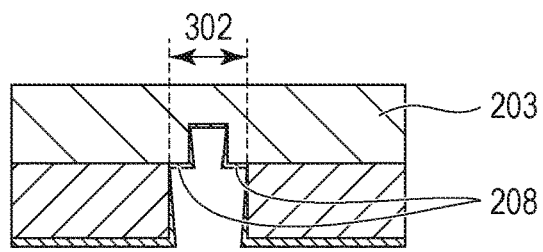
Figure 2C:
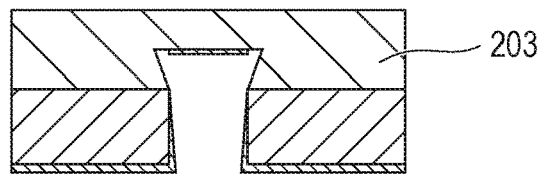
Figure 2D:
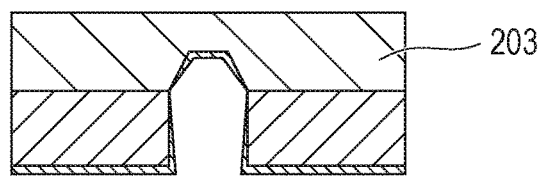

In the present disclosure, part of the lid member 203 is removed such that the surface of the lid member 203 that blocks the opening 202a is recessed in a direction away from the first surface. In this regard, as shown in FIG. 2A, the opening diameter 302 of a region of the lid member 203, which is removed, can be larger than the opening diameter 301 of the opening 202a. Further, when the substrate 201 is viewed from below in the vertical direction, it is desirable that the lid member 203 not extend into the opening 202a. When the lid member 203 extends into the opening 202a, as shown in FIG. 2B, a film 208 may be formed on the lid member that extends into the opening 202a. If the film 208 is not completely removed with the lid member 203, there is a possibility that the film 208 remains at a location at which the through hole is blocked. Even in a film formation method with a relatively high degree of rectilinear propagation, films may be slightly formed on the side walls of the space 204 and the through hole 207 shown in FIG. 1C'. Therefore, the opening diameter 302 of a region of the lid member 203, which is removed, is preferably 2 μm or more larger than the opening diameter 301 of the opening 202a, on each side. In addition, for the same reason, the shape of the side walls of the space 204 and the shape of the through hole 207 can be a forward-tapered shape in which the angles formed by the side walls with the first surface 201a of the substrate 201 are less than 90 degrees (FIG. 2C). Meanwhile, in the case of a reverse tapered side wall shown in FIG. 2D, a film is also easily formed on the side wall of the lid member 203. Therefore, in this case, the angle of the above-described forward taper formed by the side wall of the through hole 207 with the first surface 201a of the substrate 201 is preferably less than 88 degrees.

Figure 6:
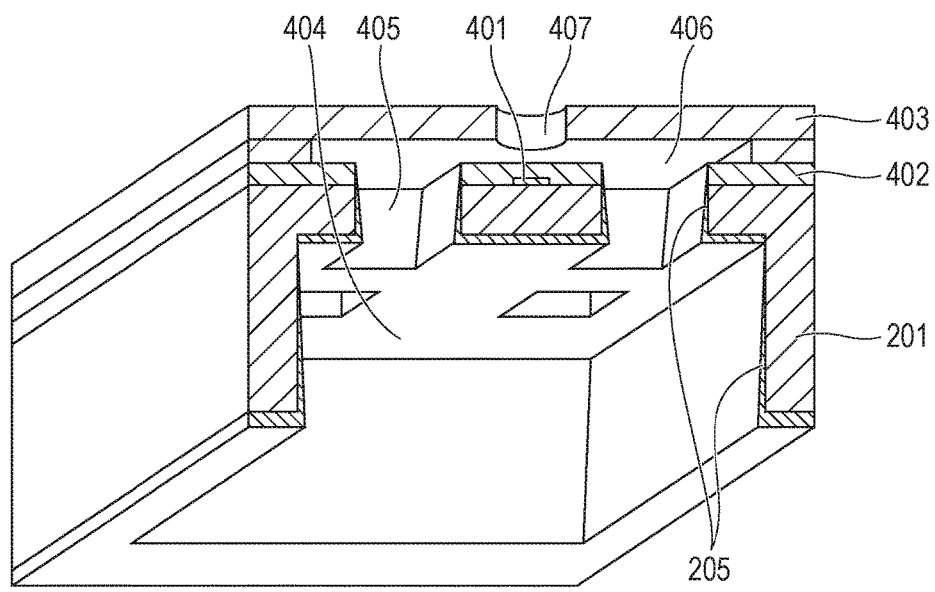
FIG. 6 is a diagram showing an inkjet print head, according to an embodiment of the present disclosure.

Next, an example in which the method for forming a film according to the present disclosure is applied to formation of a protective film of a supply hole of an inkjet print head will be described. The structure of the inkjet print head is shown in FIG. 6. The inkjet print head includes a substrate 201 that includes an energy-generating element 401, a drive circuit 402 for wiring lines and the like, and a passage-forming member 403. The energy-generating element 401 is an element for generating energy to discharge ink from an ink discharge port 407. The passage-forming member 403 forms a passage 406 and the ink discharge port 407. A first supply hole 404 and a second supply hole 405, which serve as supply holes for supplying the ink, are located in the substrate 201 and when combined constitute a through hole.

The side walls of the first supply hole 404 and the second supply hole 405, which serve as through holes, are covered with a film 205 which serves as a protective layer.

FIGS. 3A to 3E show the manner of forming a protective film for a supply hole. FIGS. 3A to 3E show the shape of the cross section of the inkjet print head shown in FIG. 6, in accordance with the manufacturing process.

Figure 3A:
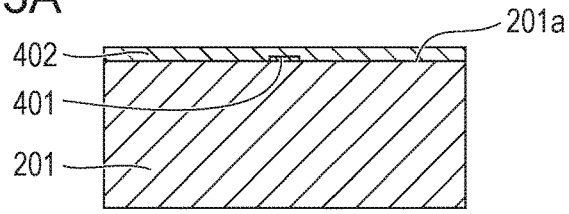
FIGS. 3A to 3E are diagrams showing the manner of forming a protective film for a supply hole of an inkjet print head, according to an embodiment of the present disclosure.

As shown in FIG. 3A, the substrate 201 is prepared. The energy-generating element 401 and the drive circuit 402 are disposed on the first surface 201a of the substrate 201.

Figure 3B:
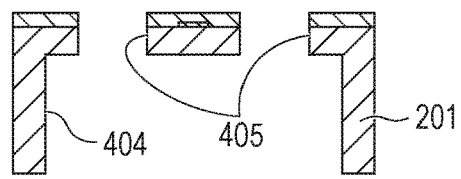

As shown in FIG. 3B, the first supply hole 404 and the second supply hole 405 are formed in the substrate 201. The first supply hole 404 and the second supply hole 405 communicate with each other thereby forming the through hole that passes through the substrate 201. In this manner, the substrate having the through hole is prepared.

Figure 3C:
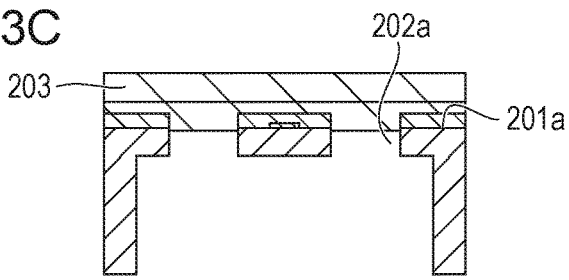

As shown in FIG. 3C, a lid member 203 is formed on the first surface 201a so as to block an opening 202a of the through hole open on the first surface 201a side. Here, the lid member 203 is composed of two photosensitive resin layers.

Figure 3D:
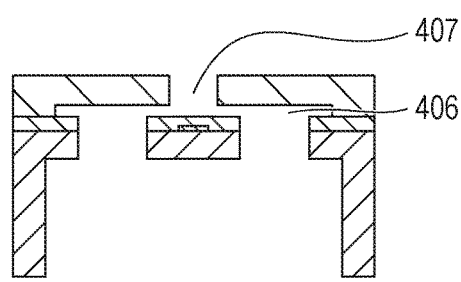

The lid member 203 is subjected to pattern exposure and development. Consequently, as shown in FIG. 3D, the passage 406 and the discharge port 407 are formed in the lid member 203. Here, the passage 406 is formed by developing the lid member 203 and, thereby, the surface of the lid member 203 that blocks the opening 202a is recessed in a direction away from the first surface 201a.

Figure 3E:
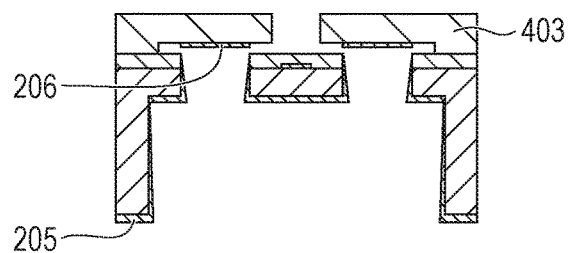

As shown in FIG. 3E, the film 205 that covers the side wall of the through hole is formed. The film 205 is formed by the same method as that described with reference to FIG. 1D. Thereafter, necessary electric connections and the like are established so as to complete the inkjet print head. In this manufacturing method, the lid member 203 also serves as a passage-forming member which is a structure of the inkjet print head. Therefore, it is not necessary to separately form the lid member 203, thereby providing an advantage of simplification of the manufacturing process. In particular, regarding the inkjet print head, if a foreign substance enters the passage, discharge may be affected. Accordingly, simplification of the manufacturing process is associated with an improvement of discharge reliability.

When the inkjet print head is produced by this method, as shown in FIG. 3E, a film may adhere to the wall on the passage side of the passage-forming member 403 (film 206). If the film 206 peels, the film may serve as a foreign substance and enter the passage so as to affect discharge. In order to suppress this, it is effective to select materials which enhance adhesiveness between the passage-forming member 403 (that is, lid member 203) and the film 206 (film 205) such that the film does not easily peel from the passage-forming member. Specifically, the lid member 203 can be formed of an epoxy resin and the film 205 can be formed of a silicon carbide (SiC) film.

Figure 4A:
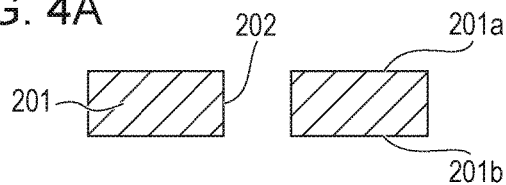
FIGS. 4A to 4F are diagrams showing the manner of removing a lid member after a film is formed on a side wall of a through hole, according to an embodiment of the present disclosure.
Figure 4B:
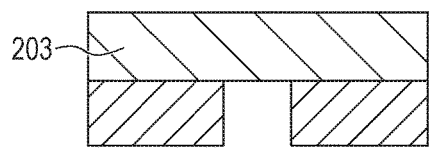

A method for removing the lid member after the film 205 is formed will be described in more detail with reference to FIGS. 4A to 4F. The descriptions with reference to FIGS. 4A and 4B are the same as those described with reference to FIGS. 1A and 1B. When the lid member is removed after the film 205 is formed, an easy-to-remove tape can be used as the lid member 203. The tape is a member including a support layer and a bonding layer. Regarding the tape, a thermal release tape, in which a bonding force of a bonding layer is reduced by heat, or an ultraviolet-curable tape, in which the bonding force of the bonding layer is reduced by ultraviolet irradiation, can be used.

Figure 4C:
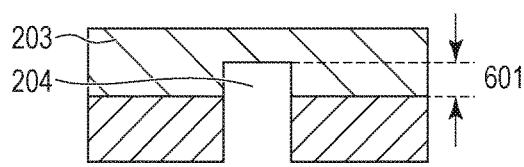
Figure 4C:
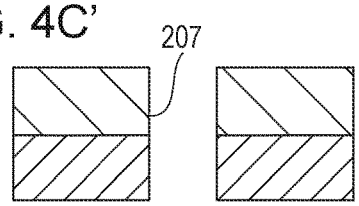

After the lid member 203 is formed, as shown in FIG. 4C, part of the lid member 203 is removed by, for example, performing etching through the opening 202a so as to locate a space 204. This is the same as that described with reference to FIG. 1C. The width 601 in the depth direction of the space 204 can be larger than the thickness of the film 205 formed later. This is because if the width 601 of the space 204 is smaller than the thickness of the film 205, a film formed on the side wall of the through hole 202 and a film formed on the lid member 203 are continuously connected to each other and may remain as a residue of the film when the lid member 203 is removed in a downstream step. In consideration of this, a through hole 207 can be formed in the lid member 203 as shown in FIG. 4C', if the lid member 203 is removed in a downstream step.

Figure 4D:
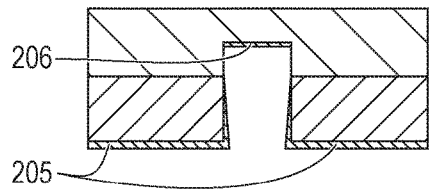

Thereafter, as shown in FIG. 4D, the film 205 that covers the side wall of the through hole is formed. The film 205 is formed on the side wall of the through hole and on a ceiling portion of the space 204 (film 206). This point is basically the same as that described with reference to FIG. 1D, but the method for forming the film 205 can be a method with a higher degree of rectilinear propagation. Examples of methods with a high degree of rectilinear propagation include a chemical vapor deposition (CVD) method, a sputtering method, and an evaporation method. In addition, the opening diameter of the space 204 in the lid member 203 or the through hole 207 can be made larger than the opening diameter of the through hole in the substrate, and the side wall shape of the space 204 in the lid member 203 or the side wall shape of the through hole 207 can be made to be a forward-tapered type. This is because if a continuous film is formed on the side wall of the through hole 202 of the substrate 201 and the side wall of the space 204 in the lid member 203 or the through hole 207, a film residue 602 may be generated after removal of the lid member 203 as shown in FIG. 4F.

Figure 4E:
Figure 4F:
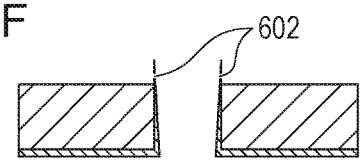

As shown in FIG. 4E, the lid member 203 is removed. According to the above-described method, for example, regarding a substrate having a circuit and the like on one surface, it is possible to form a film on only a surface opposite to the one surface while the surface provided with the circuit is protected from the film.

Figure 5A:
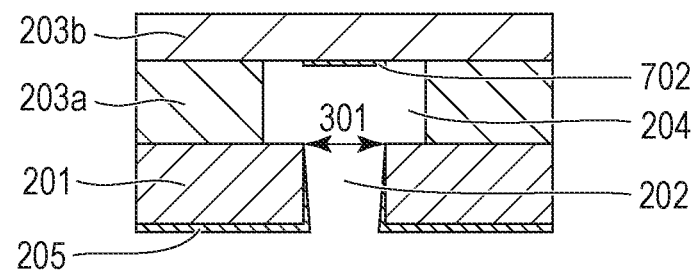
FIGS. 5A to 5C are diagrams showing a lid member having a two-layer configuration, according to an embodiment of the present disclosure.
Figure 5B:
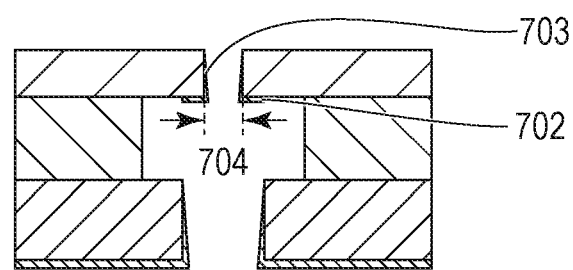
Figure 5C:
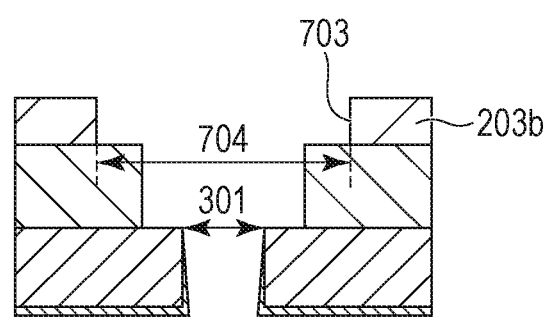

An example in which a lid member is composed of at least two layers will be described with reference to FIGS. 5A to 5C. In FIGS. 5A to 5C, the lid member is composed of a first lid member 203a and a second lid member 203b. In FIG. 5B, a through hole 703 is formed in the second lid member 203b. When the lid member has a two-layer configuration, a film is formed on the side wall of the through hole 202 while the first lid member 203a is protected by the second lid member 203b. In particular, when the first lid member 203a also serves as a functional structure in a downstream step or a product, for example, the first lid member 203a is a passage-forming member, it is possible to protect the first lid member from an unnecessary film and a foreign substance so as to improve the yield and the reliability of the product.

The second lid member 203b may be formed of an organic material or an inorganic material. Regarding the organic material, formation may be performed by using the same material and manufacturing method as those described with reference to FIGS. 1A to 1E. The second lid member 203b can be a tape including a bonding layer composed of a resin material and a BASE PLATE as long as the through hole 703 is not formed. This is because the cost is low and the process is simple in the same manner as in the first lid member 203a. When the second lid member 203b is formed of an inorganic material, silicon, glass, silicon nitride, gallium arsenide, gallium nitride, alumina, stainless steel, or the like is used. In this case, the second lid member 203b may be a chuck of a film formation device. In addition, a plastic substrate may be used.

The case where the film 205 is formed in the state in which a through hole is not formed in the second lid member 203b as shown in FIG. 5A or the opening diameter 704 of a through hole 703 formed in the second lid member 203b is smaller than the opening diameter 301 of the through hole in the substrate as shown in FIG. 5B is considered. In this case, as shown in FIGS. 5A and 5B, a film 702 may be formed on the second lid member 203b through the through hole 202 in the substrate and the space 204 in the first lid member 203a. In order to avoid formation of the film 702 on the second lid member 203b, the opening diameter 704 of the through hole 703 in the second lid member 203b can be made larger than the opening diameter 301 of the through hole in the substrate, as shown in FIG. 5C.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-229031 filed Nov. 25, 2016, which is hereby incorporated by reference herein in its entirety.

What is claimed is:

1. A method for forming a film that covers a side wall of a through hole in a substrate having the through hole, the method comprising, in order, the steps of:
   providing a substrate having a through hole that passes therethrough from a first surface to a second surface, the second surface being a surface opposite to the first surface;
   forming, on the first surface, a lid member that blocks an opening of the through hole open on the first surface;
   recessing, in a direction away from the first surface, a surface of the lid member that blocks the opening by removing part of the lid member through the opening; and
   forming a film that covers the side wall of the through hole.

2. The method for forming a film according to claim 1, wherein the lid member is removed from the substrate after the film that covers the side wall of the through hole is formed.

3. The method for forming a film according to claim 2, wherein a space is located inside the lid member in the recessing, in a direction away from the first surface, of a surface of the lid member that blocks the opening.

4. The method for forming a film according to claim 2, wherein a through hole is formed in the lid member in the recessing, in a direction away from the first surface, of a surface of the lid member that blocks the opening.

5. The method for forming a film according to claim 2, wherein the lid member is a dry film.

6. The method for forming a film according to claim 2, wherein the lid member is a tape bonding layer.

7. The method for forming a film according to claim 1, wherein the lid member is a dry film.

8. The method for forming a film according to claim 1, wherein a through hole is formed in the lid member in the recessing, in a direction away from the first surface, of a surface of the lid member that blocks the opening.

9. The method for forming a film according to claim 2, wherein the lid member contains a photosensitive resin.

10. The method for forming a film according to claim 2, wherein the film is formed by any one of an ALD method, a CVD method, a sputtering method, and an evaporation method.

11. The method for forming a film according to claim 1, wherein the lid member contains a photosensitive resin.

12. The method for forming a film according to claim 1, wherein the lid member is a tape bonding layer.

13. The method for forming a film according to claim 1, wherein the film is formed by any one of an ALD method, a CVD method, a sputtering method, and an evaporation method.

14. The method for forming a film according to claim 1, wherein a space is located inside the lid member in the recessing, in a direction away from the first surface, of a surface of the lid member that blocks the opening.

15. The method for forming a film according to claim 1, wherein the film is at least one of a silicon oxide film, a silicon nitride film, a silicon carbide film, tantalum, gold, and nickel.

16. The method for forming a film according to claim 1, wherein the lid member does not extend into the through hole in the substrate when the substrate is viewed from below in the vertical direction after the recessing, in a direction away from the first surface, of a surface of the lid member that blocks the opening.

17. The method for forming a film according to claim 1, wherein a space or a through hole with a side wall having a forward-tapered shape is formed in the lid member by the recessing, in a direction away from the first surface, of a surface of the lid member that blocks the opening.

18. The method for forming a film according to claim 1, wherein the lid member is composed of at least 2 layers.

19. A method for manufacturing an inkjet print head including a supply hole provided with a protective film that protects the supply hole of the inkjet print head, the method comprising, in order, the steps of:
   providing a substrate having a supply hole that passes therethrough from a first surface to a second surface, the second surface being a surface opposite to the first surface;
   forming, on the first surface, a lid member that blocks an opening of the supply hole open on the first surface;
   recessing, in a direction away from the first surface, a surface of the lid member that blocks the opening by removing part of the lid member through the opening; and
   forming a film that covers the side wall of the supply hole.

20. The method for manufacturing an inkjet print head according to claim 19, wherein the lid member is a passage-forming member that forms an ink passage.

* * * * *